United States Patent [19]

Sugo et al.

[11] Patent Number: 4,538,244
[45] Date of Patent: Aug. 27, 1985

[54] SEMICONDUCTOR MEMORY DEVICE

[75] Inventors: Yasuhisa Sugo, Yokohama; Tohru Takeshima, Tokyo, both of Japan

[73] Assignee: Fujitsu Limited, Kanagawa, Japan

[21] Appl. No.: 686,818

[22] Filed: Dec. 27, 1984

[30] Foreign Application Priority Data

Dec. 29, 1983 [JP]  Japan ................... 58-247704

[51] Int. Cl.³ ............................................ G11C 11/40
[52] U.S. Cl. ..................................... 365/155; 365/154; 357/43
[58] Field of Search ................. 365/154, 155, 174; 357/43

[56] References Cited

U.S. PATENT DOCUMENTS 4,480,319  10/1984  Hotta et al. ...................... 365/155

FOREIGN PATENT DOCUMENTS 5843485  4/1978  Japan .

Primary Examiner—Terrell W. Fears
Attorney, Agent, or Firm—Armstrong, Nikaido, Marmelstein & Kubovcik

[57] ABSTRACT

A semiconductor memory device in which a bipolar memory cell includes two cross-coupled transistors. The collector load is a Schottky barrier diode. A capacitor is formed to be connected to the Schottky barrier diode. The capacitor is formed by a junction between a P+-type diffusion region and an N+-type buried layer functioning as a collector of the transistor. The P+-type diffusion region is formed in the periphery of the Schottky barrier diode and between a metal layer connected to a word line and the N+-type buried layer. By the capacitor, the stability of the memory holding state is improved without deteriorating the operating speed of the memory cell.

8 Claims, 5 Drawing Figures

SEMICONDUCTOR MEMORY DEVICE

BACKGROUND OF THE INVENTION

1. Field of the Invention

The present invention relates to a semiconductor memory device, more particularly, to a semiconductor memory device with improved stability of operation in each bipolar memory cell having Schottky barrier diodes as loads.

2. Description of the Related Art

In a semiconductor memory device, it is necessary that the contents of the memory in a memory holding state not be easily changed due to alpha rays or other external noise. To stabilize the memory holding state, the voltage difference between the base and the collector of a transistor in a memory cell may be increased when the transistor is in an OFF state. The voltage difference between the base and the collector of the OFF-state transistor is determined by the product of a holding current flowing through the memory cell during the memory holding state and a load resistance of the transistor.

There are, however, problems with this. That is, if the load resistance is too large, the operating speed of the memory cell is lowered. If the holding current is increased, the power consumption of the overall semiconductor device is increased. Also, when a Schottky barrier diode is connected in parallel with the load resistance for preventing oversaturation of the transistor, the above-mentioned product of the holding current and the load resistance must be lower than the clamp voltage of the diode. The clamp voltage of the diode cannot be made higher than a predetermined value, for example, 0.4 V, to ensure the stability of the memory holding state.

As prior art in this field, Japanese Unexamined Patent Publication No. 53-43485, published on Apr. 19, 1978, Applicant: Hitachi Ltd., discloses a semiconductor memory cell in which a capacitor is connected in parallel with the Schottky barrier diode. The capacitor is provided for achieving high speed operation. In this reference, however, a highly doped diffusion region is used for obtaining both the Schottky barrier diode and the capacitor. Therefore, the forward voltage $V_F$ of the Schottky barrier diode is too small, and the stability of the memory cell is not sufficiently high.

SUMMARY OF THE INVENTION

Accordingly, an object of the present invention is to provide a semiconductor memory device in which the holding state of a memory cell is stabilized without increasing a load resistance or the holding current and without decreasing the forward voltage of a Schottky barrier diode.

To attain the above object, there is provided, according to the present invention, a semiconductor memory device including a plurality of word lines; a plurality of bit lines intersecting to the word lines; and bipolar memory cells arranged on intersecting portions between the word lines and the bit lines. Each of the bipolar memory cells includes a first transistor, a second transistor, and a load connected between the collector of each of the first transistor and the second transistor and one of the word lines. The base and the collector of the first transistor are respectively connected to the collector and the base of the second transistor. The load includes a Schottky barrier diode and a load resistor connected in parallel. The load further includes a capacitor connected in parallel with the Schottky barrier diode. Each of the first transistor and the second transistor includes a semiconductor layer, having a first conductivity type and operatively functioning as a collector region, and a high concentration buried layer formed in the semiconductor layer. The high concentration buried layer has the first conductivity type. The Schottky barrier diode includes a Schottky barrier region formed at the surface of the semiconductor layer. On the Schottky barrier region, a semiconductor region having a second conductivity type is formed so as to reach said high concentration buried layer. The capacitor is formed by a junction between the semiconductor region and the high concentration buried layer.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, a conventional semiconductor memory device will first be described with reference to FIGS. 1 and 2.

Figure 1:
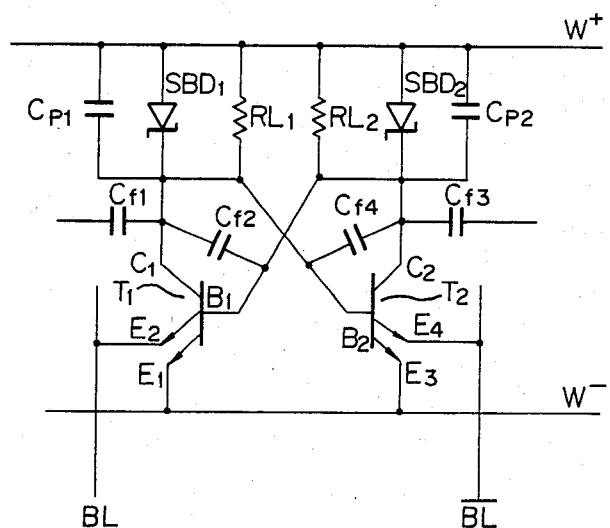
FIG. 1 is a circuit diagram of a memory cell in a conventional semiconductor memory device.

FIG. 1 is a circuit diagram of a memory cell in the conventional semiconductor memory device disclosed in Japanese Unexamined Patent Publication No. 53-43485. In FIG. 1, the memory cell includes two multiemitter NPN transistors $T_1$ and $T_2$. The base and the collector of the transistor $T_1$ are respectively connected to the collector and the base of the transistor $T_2$. Between the collector of the transistor $T_1$ and a word line $W+$, a Schottky barrier diode $SBD_1$ and a resistor $R_1$ are connected in parallel to form a load of the transistor $T_1$. Also, between the collector of the transistor $T_2$ and the word line $W+$, a load is connected consisting of a Schottky barrier diode $SBD_2$ and a resistor $R_2$ connected in parallel. The first emitters $E_1$ and $E_3$ of the transistors $T_1$ and $T_2$ respectively are connected to a hold current line $W-$ which is connected to a hold current source (not shown). The second emitters $E_2$ and $E_4$ of the transistors $T_1$ and $T_2$ are respectively connected to a bit line BL and a bit line $\overline{BL}$.

Conventionally, as disclosed in the above reference, in order to attain high speed operation, capacitors $C_{p1}$ and $C_{p2}$ are respectively connected to the Schottky barrier diodes $SBD_1$ and $SBD_2$ in parallel.

Capacitors $C_{f1}$ and $C_{f2}$ respectively represent floating capacitors between the collector and a substrate and between the collector and the base of the transistor $T_1$.

Capacitors $C_{f3}$ and $C_{f4}$ also represent floating capacitors between the collector and the substrate and between the collector and the base of the transistor $T_2$.

Figure 2:
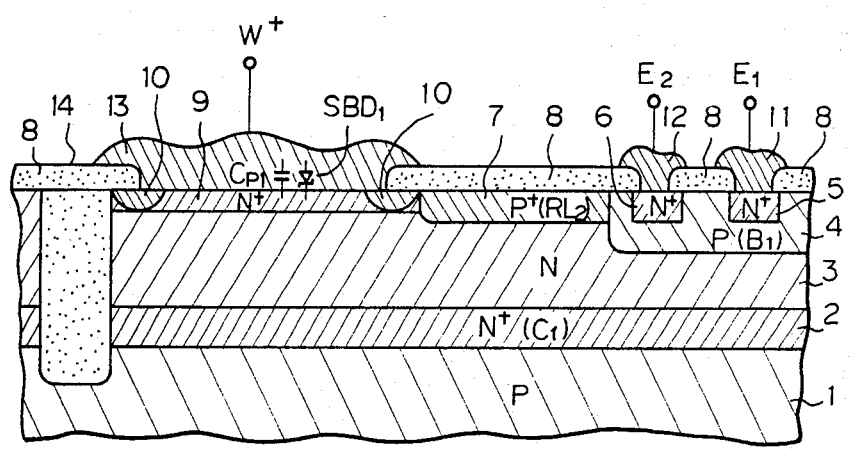
FIG. 2 is a cross-sectional view of the structure of the memory cell shown in FIG. 1.

FIG. 2 is a cross-sectional view of the structure of a part of the conventional memory cell shown in FIG. 1. In FIG. 2, on a P-type semiconductor substrate 1, a high concentration N+-type buried layer 2 functioning as the collector $C_1$ of the transistor $T_1$ (FIG. 1) is formed. The N+-type buried layer 2 is formed in an N-type epitaxial layer 3. A high concentration N+-type semiconductor layer 9 is formed between the N-type epitaxial layer 3 and a wiring metal layer 13 connected to the word line W+. Between the N+-type semiconductor layer 9 and the wiring metal layer 13, the Schottky barrier diode $SBD_1$ and the capacitor $C_{p1}$ (FIG. 1) are formed. On the periphery of the region where the Schottky barrier diode $SBD_1$ is formed, a P+-type guard ring 10 may be formed in order to stabilize the forward voltage $V_F$ of the Schottky barrier diode $SBD_1$. The conventional P+-type guard ring 10 is shallowly formed.

Because of the high concentration in the N+-type semiconductor layer 9, a large capacitance of the capacitor $C_{p1}$ is realized so that the operating speed of the memory cell is improved, as described in the afore-mentioned reference.

However, also because of the high concentration of the N+-type semiconductor layer 9, the Schottky barrier between the N+-type semiconductor layer 9 and the metal layer 13 is too low to keep the memory holding state good in stability.

Embodiments of the present invention will now be described.

Figure 3:
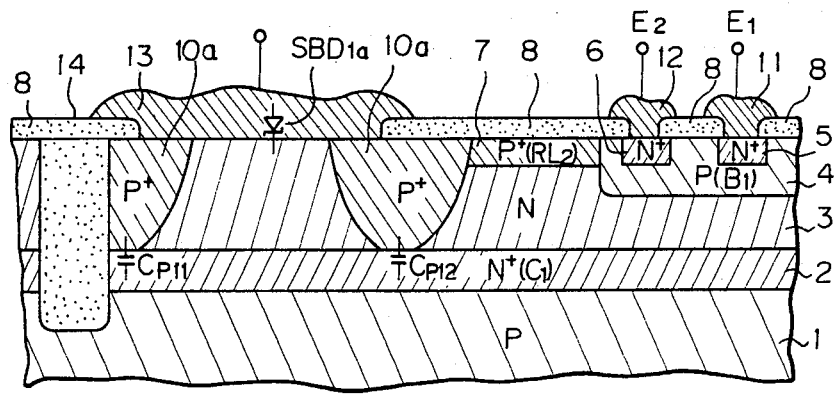
FIG. 3 is a cross-sectional view of the structure of a memory cell in a semiconductor memory device according to an embodiment of the present invention.

FIG. 3 is a cross-sectional view showing the structure of a part of a memory cell according to an embodiment of the present invention. In FIG. 3, the same portions as those in FIG. 2 are represented by the same reference numerals. The main difference between FIGS. 2 and 3 is that, in FIG. 3, in place of the high concentration N+-type semiconductor layer 9 and the shallow guard ring 10 shown in FIG. 2, a deep P+-type guard ring 10a is formed on the entire periphery of the Schottky barrier region. The P+-type guard ring 10a reaches the high concentration N+-type buried layer 2. A Schottky barrier diode $SBD_{1a}$ is formed between the metal layer 13 and the N-type epitaxial layer 3. Since the high concentration N+-type semiconductor layer 9 shown in FIG. 2 is eliminated in FIG. 3, the forward voltage $V_F$ of the Schottky barrier diode $SBD_{1a}$ is higher than the conventional one. Therefore, the stability of the memory holding state is good. In addition, capacitors $C_{p1a}$ and $C_{p2a}$ are formed between the high concentration +-type guard ring 10a and the high concentration N+-type buried layer 2. The capacitances of the capacitors $C_{p1a}$ and $C_{p2a}$ are large because of the high concentration. Therefore, the operating speed of the memory cell is high.

Figure 4:
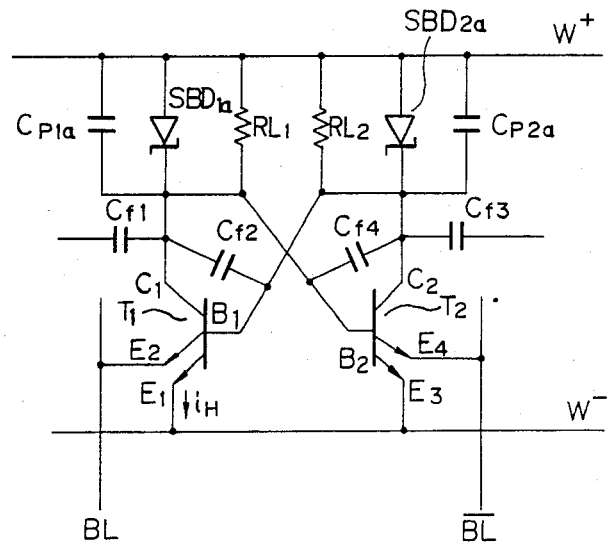
FIG. 4 is a circuit diagram of a memory cell of the present invention.

FIG. 4 is a circuit diagram of the memory cell shown in FIG. 3. The circuit diagram itself is almost the same as that shown in FIG. 1, except that, in place of the capacitors $C_{p1}$ and $C_{p2}$ and the Schottky barrier diodes $SBD_1$ and $SBD_2$ shown in FIG. 1, FIG. 4 shows capacitors $C_{p1}$ and $C_{p2}$ and Schottky barrier diodes $SBD_{1a}$ and $SBD_{2a}$. The capacitor $C_{p1a}$ is formed by a parallel connection of the capacitors $C_{p11}$ and $C_{p12}$ shown in FIG. 3. The Schottky barrier diode $SBD_{1a}$ has a higher forward voltage $V_F$ than that of the conventional Schottky barrier diode $SBD_1$ shown in FIG. 1. The capacitor $C_{p2a}$ and the Schottky barrier diode $SBD_{2a}$, although they are not shown in FIG. 3, can be formed in the same way as the structure shown in FIG. 3.

The operation of the memory cell shown in FIG. 4 is as follows.

Assume that, in the memory holding state, the transistor $T_1$ is in an ON state and the transistor $T_2$ is in an OFF state. In this state, a holding current $i_H$ flows from the word line W+ through the load resistor $RL_1$ or the Schottky barrier diode $SBD_{1a}$, the collector $C_1$, and the emitter $E_1$ of the transistor $T_1$, to the hold current line W−. On the other hand, since the transistor $T_2$ is cut off, almost no current flows through the load resistor $RL_2$, and the Schottky barrier diode $SBD_{2a}$ is in a cut-off state. Therefore, the base potential of the transistor $T_1$ is pulled up to a high level by the load resistor $RL_2$ so that the transistor $T_1$ is kept at the ON state. On the other hand, the base potential of the transistor $T_2$ is lower than the potential of the word line W+ by the voltage drop across the load resistor $RL_1$ or by the clamp voltage across the Schottky barrier diode $SBD_{1a}$, so that the transistor $T_2$ is kept at the OFF state. If the voltage across the load resistor $RL_1$ exceeds the clamp voltage $V_F$ of the Schottky barrier diode $SBD_{1a}$, the diode $SBD_{1a}$ turns on. Thus, the collector potential of the transistor $T_1$ is kept higher than a predetermined value. That is, the transistor $T_1$ is prevented from being oversaturated so as to ensure high speed operation of the memory cell.

In the above-mentioned memory holding state, if noise is generated so that, for example, the potential of the bit line $\overline{BL}$ is lowered, the cut-off transistor $T_2$ tends to be conductive. If the potential difference between the bases of the transistors $T_1$ and $T_2$ is small or if the floating capacitances $C_{f1}$, $C_{f2}$, $C_{f3}$, and $C_{f4}$ are very small, the transistor $T_2$ is turned on due to the above-mentioned noise, so that the above-mentioned memory holding state is easily inverted. Assume that the resistance of the load resistor $RL_1$ is R. Then, the abovementioned potential difference between the bases is nearly equal to $i_H \cdot R$, unless the potential difference does not exceed the clamp voltage $V_F$. Therefore, the stability of the memory holding state is proportional to the value $i_H \cdot R$. However, to increase the hold current $i_H$ is not preferable because it raises the power consumption of the overall memory device. Also, to increase the resistance R of the load resistor $RL_1$ is not preferable because it reduces the operating speed of the memory cell. Further, even when the value $i_H \cdot R$ is designed to exceed the clamp voltage $V_F$, the potential difference between the bases is clamped to the voltage $V_F$ because the Schottky barrier diode $SBD_{1a}$ becomes always conductive. On the other hand, if the capacitances of the junction capacitors $C_{f1}$ through $C_{f4}$ are made large, the operating speed of the memory is also lowered and the characteristics of the transistors $T_1$ and $T_2$ are deteriorated.

This similarly applies to the case where the transistor $T_1$ is in an OFF state and the transistor $T_2$ is in an ON state.

According to the embodiment of the present invention, the capacitors $C_{p1a}$ and $C_{p2a}$ are respectively connected in parallel to the Schottky barrier diodes $SBD_{1a}$ and $SBD_{2a}$. This construction results in the stabilization of the memory holding state without deterioration of the high speed operation of a memory cell. That is, when the transistor $T_1$ is in an ON state and the transistor $T_2$ is in an OFF state, the capacitor $C_{p1a}$ is charged up by the holding current $i_H$. In this state, the capacitor $C_{p2a}$ does not store any charge because it is not supplied with the holding current $i_H$. In this memory holding state, even when noise which tends to invert the transistor $T_2$ to an OFF state is generated, the memory holding state is not inverted until the completion of discharge of the capacitor $C_{p1a}$ and of charge-up of the capacitor $C_{p2a}$. The discharge and charge-up take a considerable time. As a result, the memory holding state is stabilized. Although the operating speed of the memory cell for reading or writing seems to be slightly lowered due to the provision of the capacitors $C_{p1a}$ and $C_{p2a}$, the potential at the word line $W+$ is raised higher than a power supply voltage during a reading or writing operation so that the potential at the collector $C_1$ or $C_2$ of the transistor $T_1$ or $T_2$ can immediately follow the potential at the word line $W+$ through the capacitor $C_{p1a}$ or $C_{p2a}$ which is not charged up. Therefore, the operating speed of the memory cell is not lowered but is rather raised. Further, as mentioned before, since the states of the transistors $T_1$ and $T_2$ are not easily changed due to the provision of the capacitors $C_{p1a}$ and $C_{p2a}$, there is an advantage that few write errors due to noise during a writing operation occur. Still further, because the forward voltage $V_F$ of the Schottky barrier diode $SBD_{1a}$ or $SBD_{2a}$ is larger than that of the conventional Schottky barrier diode $SBD_1$ or $SBD_2$ shown in FIG. 2, the stability of the memory holding state is improved.

The highly doped P+-type guard ring 10a shown in FIG. 3 can be easily made by simply expanding the conventional P+-type guard ring 10 shown in FIG. 2.

Referring back to FIG. 3, the structure of the conventional P -type guard ring 10 shown memory cell will further be described. In FIG. 3, the structure of the transistor $T_1$, the Schottky barrier diode $SBD_{1a}$, the capacitor $C_{p1a}$, and the load resistor $RL_2$ is illustrated. On the P-type semiconductor substrate 1, the N+-type buried layer 2 functioning as the collector $C_1$ of the transistor $T_1$ is formed. The N+-type semiconductor layer 2 is formed in the bottom portion of the N-type epitaxial layer 3. At the surface of the N-type epitaxial layer 3, a P-type diffusion layer 4 functioning as the base region $B_1$ of the transistor $T_1$ is formed. At the surface of the P-type diffusion layer 4, N+-type diffusion regions 5 and 6 functioning as the emitter regions $E_1$ and $E_2$ are formed. At the surface of the N-type epitaxial layer 3 and in contact with the P-type diffusion layer 4, a P+-type diffusion layer 7 functioning as the load resistor $RL_2$ is formed. Reference numeral 8 represents an insulating oxide film. Reference numerals 11, 12, and 13 respectively represent a part of a wiring metal layer for forming the hold current line $W-$, the bit line BL, and the word line $W+$. Reference numeral 14 represents an insulating isolation region for separating the memory cell from the other memory cells.

It will be apparent that the capacitor $C_{p2a}$ and the Schottky barrier diode $SBD_{2a}$ can also be formed in a similar way as the capacitor $C_{p1a}$ and the Schottky barrier diode $SBD_{1a}$ as shown in FIG. 3.

Figure 5:
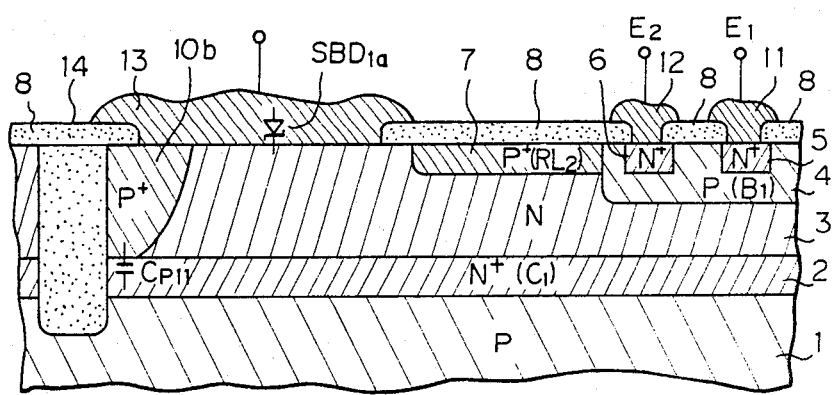
FIG. 5 is a cross-sectional view of the structure of a memory cell in a semiconductor memory device according to another embodiment of the present invention.

FIG. 5 is a cross-sectional view of the structure of a memory cell in a semiconductor memory device according to another embodiment of the present invention. The difference between FIGS. 3 and 5 is that, in place of the P+-type guard ring 10a in FIG. 3, a P+-type diffusion region 10b is formed only at one side of the guard ring. The P+-type diffusion region 10b is formed so as to reach the N+-type buried layer 2.

The circuit diagram of the memory cell shown in FIG. 5 is the same as the circuit shown in FIG. 4. The capacitance of the capacitor $C_{p1a}$ shown in FIG. 4 is realized only by the capacitor $C_{p11}$ shown in FIG. 5. Therefore, in this embodiment, the capacitor $C_{p1a}$ has a lower capacitance than that of the first embodiment. The capacitance of the capacitor $C_{p2a}$ in the second embodiment is also lower than that of the first embodiment. Although the capacitances of the capacitors $C_{p1a}$ and $C_{p2a}$ are smaller than those in the first embodiment, a high speed operation of the memory cell and the stabilization of the memory holding state are also attained by the second embodiment.

The present invention is not restricted to the foregoing embodiments. Various changes and modifications are possible within the scope of the present invention. The essence of the present invention is that, between the wiring metal layer 13 and the N+-type buried layer 2, the P+-type diffusion region is formed over part or all of the periphery of the Schottky barrier region.

From the foregoing description, it will be apparent that, according to the present invention, by providing a P+-type diffusion region between a wiring metal layer connected to a word line and a buried layer functioning as a collector of a transistor in a semiconductor memory device, the memory holding state can be stabilized without reducing the high speed operation and without increasing the power consumption.

We claim:

1. A semiconductor memory device comprising:
a plurality of word lines;
a plurality of bit lines intersecting to said word lines;
bipolar memory cells arranged on intersecting portions between said word lines and said bit lines;
each of said bipolar memory cells comprising a first transistor, a second transistor, and a load connected between the collector of each of said first transistor and said second transistor and one of said word lines;
the base and the collector of said first transistor being respectively connected to the collector and the base of said second transistor;
said load comprising a Schottky barrier diode and a load resistor connected in parallel;
said load further comprising a capacitor connected in parallel with said Schottky barrier diode;
each of said first transistor and said second transistor comprising a semiconductor layer having a first conductivity type and operatively functioning as a collector region; and
a high concentration buried layer formed in said semiconductor layer and having said first conductivity type;
said Schottky barrier diode comprising a Schottky barrier region formed at the surface of said semiconductor layer;
in said Schottky barrier region, a semiconductor region having a second conductivity type being formed so as to reach said high concentration buried layer;
said capacitor being formed by a junction between said semiconductor region and said high concentration buried layer.

2. A semiconductor memory device as set forth in claim 1, wherein said semiconductor region is formed in the entire periphery of said Schottky barrier region.

3. A semiconductor memory device as set forth in claim 1, wherein said semiconductor region is formed in a part of said periphery of said Schottky barrier region.

4. A semiconductor memory device as set forth in claim 1, wherein said semiconductor region is a diffusion region.

5. A semiconductor memory device as set forth in claim 1, wherein said semiconductor region is formed between a metal layer connected to said one of said word lines and said high concentration buried layer.

6. A semiconductor memory device as set forth in claim 1, wherein each of said first transistor and said second transistor is a multiemitter NPN transistor having a first emitter connected to a hold current line and a second emitter connected to one of said bit lines.

7. A semiconductor memory device as set forth in claim 6, wherein said first conductivity type is an N-type conductivity and said second conductivity type is a P-type conductivity.

8. A semiconductor memory device as set forth in claim 7, wherein a guard ring is formed on the periphery of said Schottky barrier region, said guard ring being formed by a $P^+$-type diffusion region, said semiconductor region being formed in least a part of said guard ring.

* * * * *